(12) United States Patent
Stella et al.

(10) Patent No.: US 8,837,154 B2
(45) Date of Patent: Sep. 16, 2014

(54) SYSTEM WITH STABILIZED HEATSINK

(75) Inventors: Cristiano Gianluca Stella, San Gregorio Di Catania (IT); Concetto Privitera, Gravina Di Catania (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 283 days.

(21) Appl. No.: 13/537,242

(22) Filed: Jun. 29, 2012

(65) Prior Publication Data

US 2013/0003313 A1    Jan. 3, 2013

(30) Foreign Application Priority Data

Jun. 30, 2011    (IT) .............................. MI2011A1208

(51) Int. Cl.
| H05K 7/20 | (2006.01) |
| H01L 23/367 | (2006.01) |
| H01L 23/40 | (2006.01) |

(52) U.S. Cl.
CPC ............ *H01L 23/3672* (2013.01); *H01L 23/40* (2013.01)
USPC ........... 361/710; 361/704; 361/709; 361/719; 165/185; 257/706; 257/713

(58) Field of Classification Search
USPC .................. 361/704, 709–710, 719; 165/185; 257/706–707
See application file for complete search history.

(56) References Cited

U.S. PATENT DOCUMENTS

| 4,147,889 A | * | 4/1979 | Andrews et al. .............. 174/546 |
| 4,611,238 A | * | 9/1986 | Lewis et al. .................... 257/722 |
| 4,748,538 A | | 5/1988 | Tsuji |
| 4,918,571 A | | 4/1990 | Grabbe |
| 5,311,395 A | | 5/1994 | McGaha et al. |
| 5,504,652 A | | 4/1996 | Foster et al. |
| 5,977,630 A | | 11/1999 | Woodworth et al. |
| 6,054,759 A | * | 4/2000 | Nakamura ..................... 257/691 |
| 6,150,254 A | | 11/2000 | Kito |
| 6,707,676 B1 | * | 3/2004 | Geva et al. .................... 361/719 |
| 6,833,997 B1 | | 12/2004 | Jones, III et al. |
| 7,145,224 B2 | | 12/2006 | Kawashima et al. |

(Continued)

FOREIGN PATENT DOCUMENTS

| EP | 0812015 A1 * | 12/1997 | ............ H01L 23/367 |
| EP | 0948047 A2 * | 10/1999 | ............. H01L 23/36 |

(Continued)

OTHER PUBLICATIONS

Italian Search Report and Written Opinion for IT MI2011A001208 mailed Feb. 15, 2012 (9 pages).

*Primary Examiner* — Robert J Hoffberg
(74) *Attorney, Agent, or Firm* — Gardere Wynne Sewell LLP

(57) ABSTRACT

An insulating body incorporates at least one integrated circuit chip and includes a mounting surface for mounting to a board and a free surface opposite the mounting surface. A heatsink is attached to the insulating body at the free surface. The heatsink includes at least one stabilizing element. The stabilizing element includes an attachment portion extending at least partially transversely to the free surface beyond a peripheral boundary of the free surface when considered in plan view. The attachment portion has a binding end bound to the free surface and a free end opposite the binding end. The stabilizing element also has a mounting portion extending from the free end of the attachment portion at least up to a plane of the mounting surface.

17 Claims, 7 Drawing Sheets

(56) References Cited

U.S. PATENT DOCUMENTS

| | | |
|---|---|---|
| 7,286,361 B2 | 10/2007 | Yamanaka |
| 7,746,650 B2 | 6/2010 | Hellinger et al. |
| 7,776,658 B2 | 8/2010 | Liu et al. |
| 7,816,784 B2 | 10/2010 | Son et al. |
| 7,851,908 B2 | 12/2010 | Otremba et al. |
| 7,892,893 B2 | 2/2011 | Obara |
| 8,062,932 B2 | 11/2011 | Hebert et al. |
| 8,154,108 B2 | 4/2012 | Liu et al. |
| 8,358,017 B2 | 1/2013 | Tsui |
| 8,390,041 B2 | 3/2013 | Yoshimochi |
| 8,481,368 B2 | 7/2013 | Xue et al. |
| 8,604,611 B2 | 12/2013 | Hauenstein |
| 2005/0161785 A1 | 7/2005 | Kawashima et al. |
| 2005/0280140 A1 | 12/2005 | Corbin et al. |
| 2006/0091512 A1 | 5/2006 | Shinohara |
| 2007/0090523 A1 | 4/2007 | Otremba |
| 2007/0108564 A1 | 5/2007 | Tang et al. |
| 2007/0215996 A1 | 9/2007 | Otremba |
| 2008/0054422 A1 | 3/2008 | Koike et al. |
| 2009/0236732 A1 | 9/2009 | Yu et al. |
| 2009/0323288 A1 | 12/2009 | Bernard |
| 2010/0133674 A1 | 6/2010 | Hebert et al. |
| 2011/0096509 A1 | 4/2011 | Yoshimochi |
| 2013/0003305 A1 | 1/2013 | Stella |
| 2013/0003308 A1* | 1/2013 | Stella ............................ 361/710 |
| 2013/0003311 A1* | 1/2013 | Privitera et al. ............... 361/718 |
| 2013/0003312 A1* | 1/2013 | Stella et al. ................... 361/719 |

FOREIGN PATENT DOCUMENTS

| | | |
|---|---|---|
| JP | 49047567 U | 4/1974 |
| JP | 58218149 A | 12/1983 |
| JP | 62104056 A | 5/1987 |
| JP | 4368155 A | 12/1992 |
| JP | 6037217 A | 2/1994 |
| JP | 8078584 A | 3/1996 |
| WO | WO-2006058030 A2 | 6/2006 |

* cited by examiner

SYSTEM WITH STABILIZED HEATSINK

PRIORITY CLAIM

This application claims priority from Italian Application for Patent No. MI2011A001208 filed Jun. 30, 2011, the disclosure of which is hereby incorporated by reference.

TECHNICAL FIELD

The present invention refers to the field of electronics. In particular, this invention relates to packages for electronic components.

BACKGROUND

Any existing electronic component is characterized by an electrical power absorption—in general, proportional to the product of a current crossing it and a voltage that develops between its terminals—during the operation of the same. A portion of the absorbed power is lost as heat according to the principles of thermodynamics. In particular, heat is generated in the "active" regions of the electronic component, i.e. where the flow of electric current occurs (for example, considering a MOS, IGBT or BJT transistor, in a region below a controlling terminal and in the regions constituting conduction terminals of the same). The generation of heat concentrated in active regions causes a temperature rise of the electronic component. The temperature of the active regions of the electronic component, better known as the junction temperature, is a parameter that strongly affects the operation of the electronic component.

For example, the threshold voltage of a MOS transistor (whose value determines the amount of current flowing in the transistor with the same control voltage applied) is inversely proportional to the junction temperature. Consequently, with the same control voltage applied, the MOS transistor draws an ever-increasing electric current flow as the temperature rises. It is also known that, with increasing junction temperature, the electrical resistance of the MOS transistor increases. Consequently, the MOS transistor dissipates between its terminals, due to the Joule effect, an ever-increasing electric power. Because of this, the junction temperature rises even more. In other words, there is established a positive feedback (better known as thermal runaway) that can cause damage or even the destruction of the MOS transistor. In addition, with the rise of the junction temperature of the MOS transistor there is a reduction of the reliability of the same (i.e., the probability of occurrence of a structural damage during the operation increases) and in general of its working life (i.e., the time for which the electronic component works properly).

The ongoing miniaturization process of the electronic components (basically a reduction in the size of the electronic component, in particular of the active regions), makes it very important to contain the rise in junction temperature within acceptable values. In fact, with the same absorbed electric power, the smaller the size of the active region of the electronic component, the higher and faster the rise in junction temperature in the same (since the dissipation of electrical power is concentrated in a smaller volume). This is particularly important for electronic components belonging to the field of the "power electronics", i.e. electronic components designed to operate at higher voltages and currents than standard electronic components (for example, with operating voltages of the order of hundreds of Volts and/or with operating current in the tens of Amperes), which are used in circuits of apparatuses belonging to various fields of application, for example, from personal computers to electro-mechanical equipment (power supply circuits of computers, electric motors actuators, inverters for photovoltaic panels, etc.).

In order to contain the rise in junction temperature in electronic components, heatsinks are known and widely used. A heatsink is an element consisting of one or more elements in thermally conductive material (e.g., aluminum), which is attached (typically by gluing) to a package of the electronic component. The package substantially comprises an insulating body (usually in plastic or ceramic) and contact pins (to connect the electronic component to tracks of an external circuit), and is intended to incorporate and protect a chip of semiconductor material wherein the electronic component is integrated.

Alternatively, the insulating body of the package may also comprise an opening—typically formed in an upper free surface of the insulating body opposite to a mounting surface towards which the pins are oriented—for exposing a dissipation plate (also made of thermally conductive material). The dissipation plate is connected to the chip of semiconductor material for improving the heat exchange with the external environment. The heatsink may be attached directly to the dissipation plate, thus facilitating a conductive heat exchange between the chip and the heatsink (thanks to the greater thermal conductivity of the materials constituting the dissipation plate and the heatsink in contact with each other with respect to the plastic ones forming the insulating body).

In more detail, the heatsinks facilitate a heat transfer by conduction (thanks to its good thermal conductivity) from the chip to itself. Furthermore, heatsinks are typically formed with a structure designed to facilitate a heat transfer by convection (for example, with a plurality of fins extending from a base through which the heatsink is attached to the insulating body or to the dissipation plate) to the environment external to the package (i.e., transferring heat to the medium that surrounds the package, for example, air). In this way, suitably sized heatsinks allow for maintaining the junction temperature below a safe temperature.

However, the heatsinks suffer from a major disadvantage, particularly when applied to small packages (for example, for incorporating miniature electronic components). In fact, the heatsinks tend to be mechanically unstable, once fixed to the package. This is due to the fact that, by reducing the package size, the available mounting surface is proportionally reduced. This reduced mounting surface may be insufficient to ensure a good mechanical stability of the heatsink on the package; consequently, the heatsink might separate from the package as a result of mechanical stresses to which it may be subjected. In addition, the weight of the heatsink and the mechanical stress may be likely to cause a deterioration, or even a breakage, of contacts formed between one or more pins of the package and the corresponding tracks to which they are attached, at most provoking their detachment and the failure of a circuit in which the electronic component is used.

SUMMARY

One or more aspects of a solution according to specific embodiments are set out in the independent claims, with advantageous features of the same solution that are set out in the dependent claims (with any advantageous features provided with reference to a specific object of the solution according to an embodiment which apply mutatis mutandis at any other of its aspects).

More specifically, one aspect of a solution according to an embodiment provides a system. The system comprises an insulating body for incorporating at least one chip of semiconductor material in which at least one electronic component is integrated. The insulating body has a mounting surface for mounting the system on a board and a free surface opposite to the mounting surface. The system also comprises a heatsink for dissipating the heat produced by said at least one electronic component. The heatsink is placed at the free surface of the insulating body. In the solution according to the present invention the heatsink comprises at least one stabilizing element. The stabilizing element has an attachment portion extending at least partly transversely to the free surface beyond a boundary of the free surface in plan view. Such attachment portion has a binding end bound to the free surface and a free end opposite the binding end. The stabilizing element also has a mounting portion extending from the free end of the connection portion at least up to a plane of the mounting surface.

Another aspect of a solution according to an embodiment provides a corresponding method for manufacturing such a system.

BRIEF DESCRIPTION OF THE DRAWINGS

A solution according to one or more embodiments, as well as additional features and its advantages will be better understood with reference to the following detailed description of an embodiment thereof, given purely by way of a non-restrictive indication and without limitation, to be read in conjunction with the attached figures (wherein corresponding elements are denoted with equal or similar references and their explanation is not repeated for the sake of brevity). In this respect, it is expressly understood that the figures are not necessarily drawn to scale (with some details that may be exaggerated and/or simplified) and that, unless otherwise specified, they are simply intended to conceptually illustrate the structures and procedures described herein. In particular.

DETAILED DESCRIPTION OF THE DRAWINGS

Figure 1A:
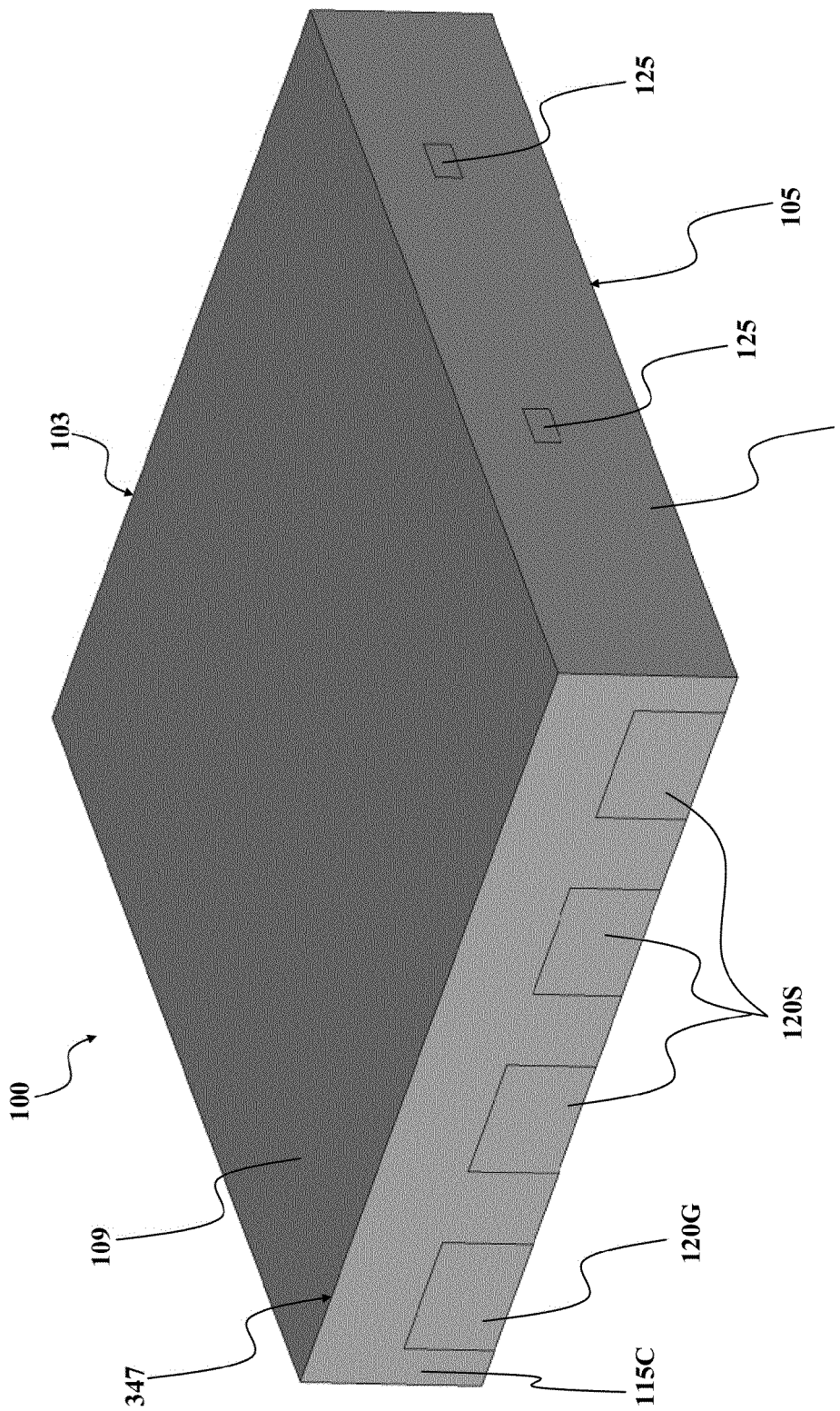
FIG. 1A illustrates a schematic axonometric view of an electronic device.
Figure 1B:
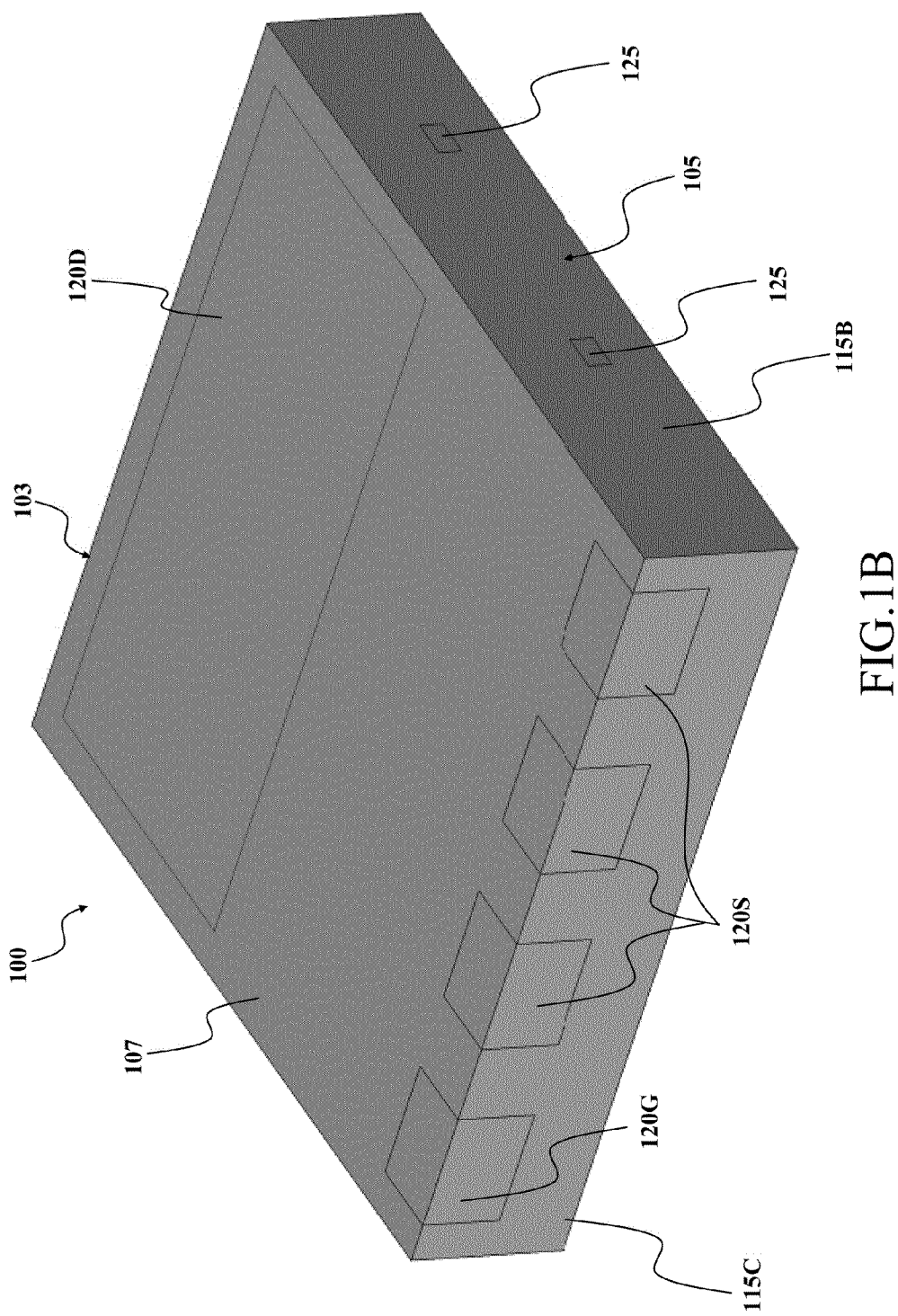
FIG. 1B illustrates a schematic axonometric view from below of the electronic device of FIG. 1A.

With reference to FIG. 1A and FIG. 1B together, there are illustrated schematic axonometric views from above and below, respectively, of an electronic device 100 wherein the solution according to an embodiment can be applied. In the example at issue, the electronic device 100 is of the Surface Mounted Technology (SMT) type, i.e. it is adapted to be mounted on a surface of a Printed Circuit Board or PCB, not shown in the figures.

The electronic device 100 comprises a package 103 formed by an insulating body 105 made of an insulating material (e.g., plastic or ceramic) substantially parallelepiped-shaped having two main surfaces, i.e. a mounting surface 107 (for on board mounting) and a free surface 109 opposite to it.

The insulating body 105 houses within one (or more) chip of semiconductor material, not visible in the figures, in which it is integrated one (or more) electronic component—from a single element, for example, a transistor, up to a complete electronic circuit, for example, a central processing unit. The function of the insulating body 105 is to isolate the chip from the external environment.

In order to achieve an electric path between the chip and elements external to the electronic device 100—thereby allowing to connect the electronic component to other electronic devices not shown—the package 103 comprises three pins 120S, a pin 120G and a pin 120D, each of which is formed by a contact pad or "pad" in electrical contact with corresponding conduction terminals of the chip (e.g., through connection wires, or "wire bonding" in the jargon, comprised within the insulating body 105, not shown in the figures). The pins 120S, 120G are generally square in shape, and extend partially on the mounting surface 107 and partially on the side surface 115C of the insulating body 105. Otherwise, the pin 120D is exposed on the mounting surface 107 and has a generally rectangular shape, and covers about half of the mounting surface 107. For example, the pin 120D is connected to a drain terminal, the pins 120S are connected to a source terminal and the pin 120G is connected to a gate terminal of a power MOS transistor. In addition, the pin 120D operates as a heatsink for transferring heat produced by the chip in operation to the board. The chip is mounted inside the insulating body 105 on a plate that defines the pin 120D; a plurality of tie-bars 125 (used to support the plate during the construction of the insulating body 105) protrude, in pairs, on each side surface of the insulating body 105, between the free surface 109 and the mounting surface 107 (with the tie-bars 125 which are then electrically connected to the pin 120D).

Figure 2:
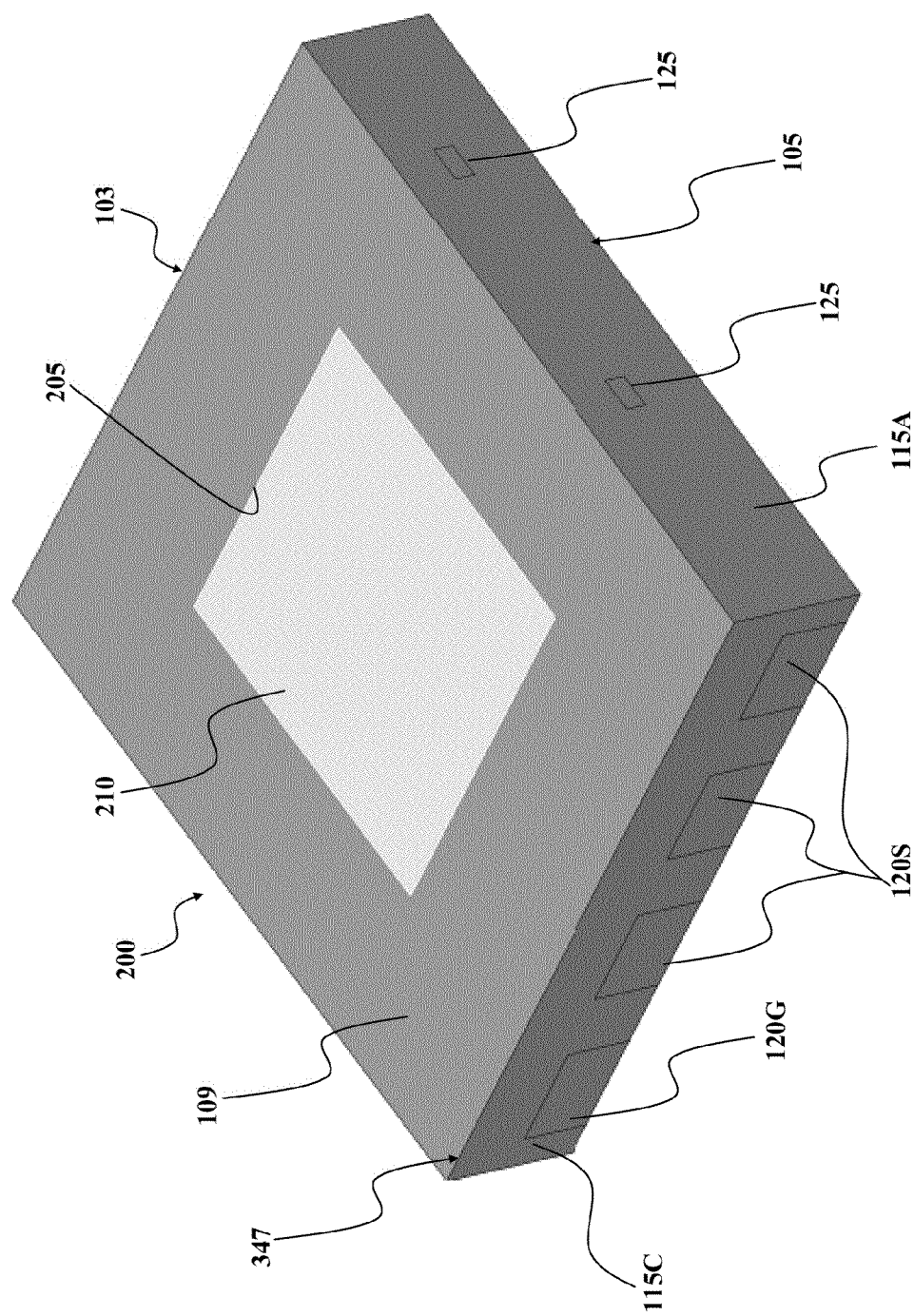
FIG. 2 illustrates a schematic axonometric view of an alternative electronic device.

Turning now to FIG. 2, there is shown a schematic axonometric view from above of an alternative electronic device 200 where the solution according to an embodiment can be applied; the electronic device 200 differs from that of FIGS. 1A and 1B as follows. In this case, at the free surface 109 of the insulating body 105 an opening 205 is formed through which a dissipation plate 210 is exposed. The dissipation plate 210 is in contact with the chip in order to transfer the heat generated by the same and then disperse it in the external environment (i.e., it operates as an additional heatsink). The dissipation plate 210 is typically formed in a thermally and electrically conductive material (e.g., copper Cu); the heat dissipation plate 210 is typically connected to the source terminal of the electronic component (and therefore also to the pins 120S).

Figure 3A:
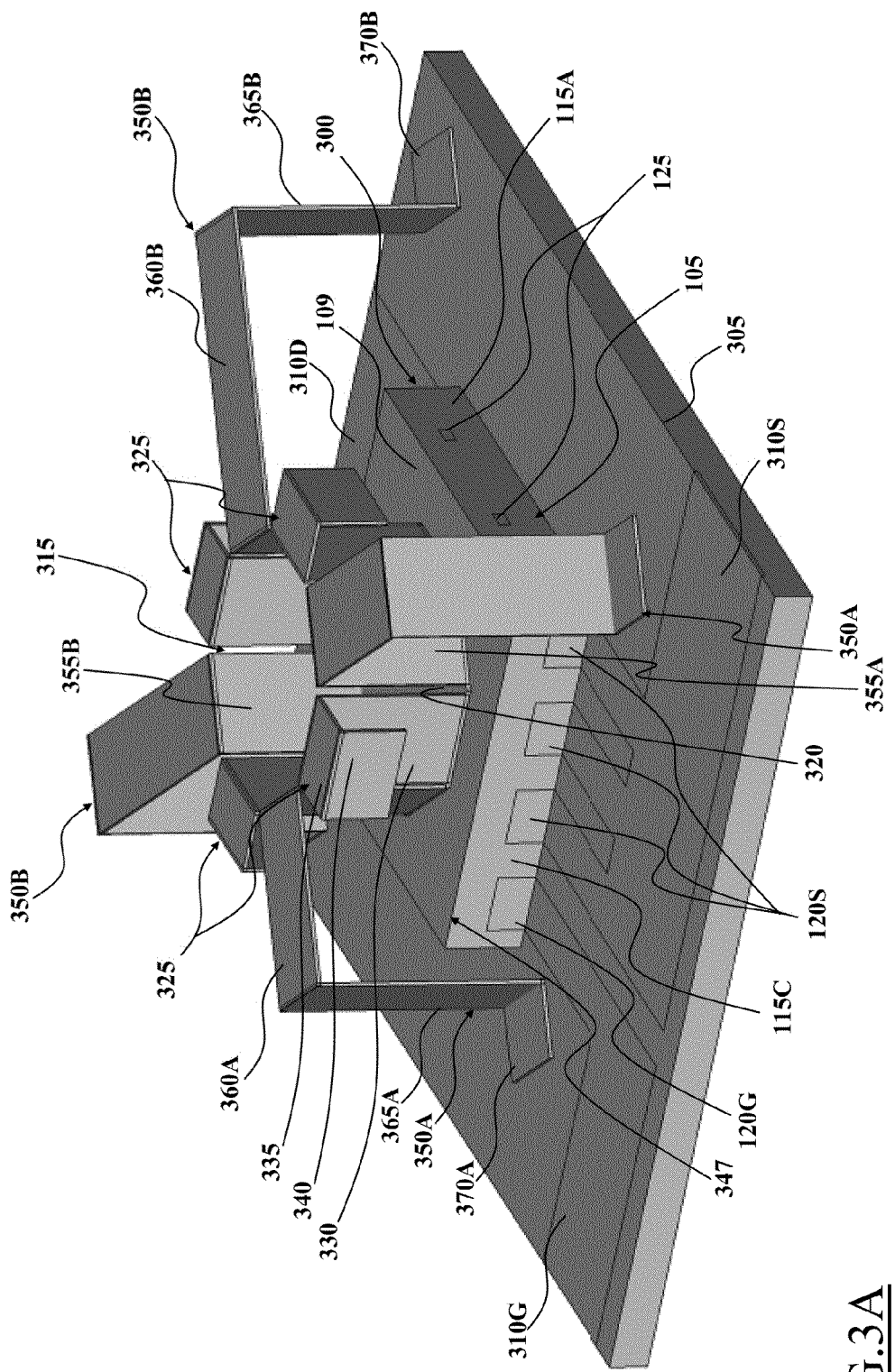
FIG. 3A illustrates a schematic axonometric view of an electronic device according to an embodiment and of a portion of the board on which it is attached.
Figure 3B:
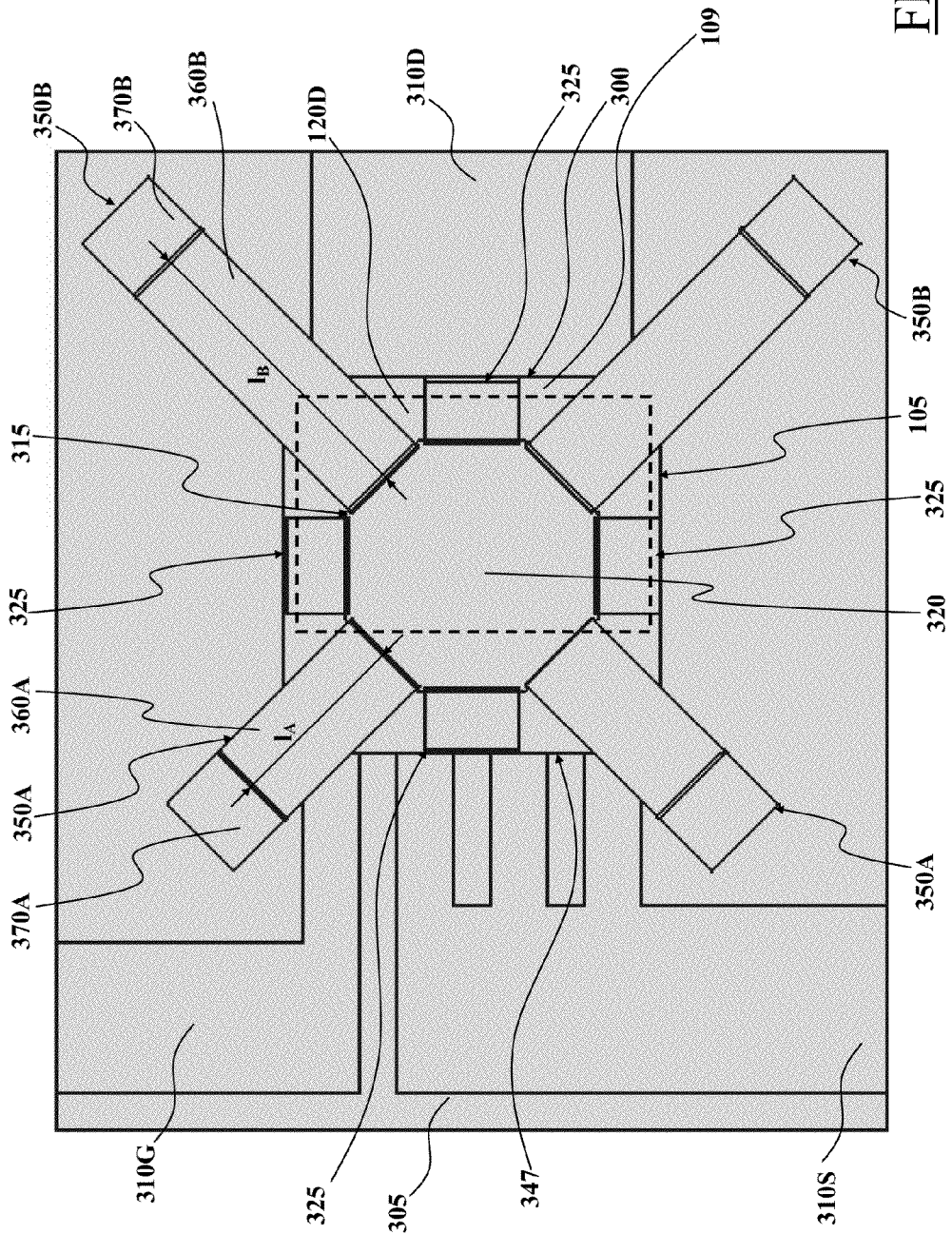
FIG. 3B illustrates a schematic plan view of the electronic device of FIG. 3A, and of the portion of the board on which it is attached.

With joint reference to FIG. 3A and FIG. 3B an electronic device 300 according to an embodiment is now described, a schematic axonometric view from above and a schematic in plan view, respectively, of which are illustrated.

As usual, the electronic device 300 is attached to a circuit board 305 (e.g., a PCB, "Printed Circuit Board"), only a portion of which is shown in the figures.

In more detail, the pins 120G, 120S (and also the pin 120D, shown in dotted line only in FIG. 3B) are attached to corresponding conductive tracks—that is, a conductive track 310G for the pin 120G, a conductive track 310S for the pin 120S, and a conductive track 310D for the pin 120D—by means of a conductive paste, and using a light pressure (pick and place), and then are reflow-soldered on the same.

The electronic device 300 also comprises a (external) heatsink 315. A base portion (or simply base) 320 of the heatsink 315 is attached at the free surface 109 of the insulating body 105 (essentially in the middle of it). When the electronic device 300 does not have any exposed dissipation plate on the free surface 109 (as in FIG. 1A-FIG. 1B), the base 320 is fixed to the insulating body 105 via a fastener (not shown in the figures), such as a thermal tape, a thermal paste or an epoxy resin. When the electronic device 300 is provided instead with the dissipating plate (not shown in the figures) exposed at the free surface 109 (as in FIG. 2), the base 320 may be attached to the dissipation plate; in this case, unless using an electrically insulating fastener (e.g., containing mica), the heatsink 315 will be electrically connected to the source terminal of the MOS transistor through the dissipation plate (and therefore also to the pin 120S). It should be noted that, in general, the heatsink 315 is not welded to the dissipation plate 210; in fact, a weld could result in an uneven attachment (for example, air bubbles could remain trapped in the used filler material) reducing the thermal conductivity between the heatsink 315 and the dissipation plate 210.

The heatsink 315 comprises fins 325 (four in the embodiment shown in the figures) that extend in pairs from opposite sides along a perimeter of the base 320. The fins 325 are partially transversal to the free surface 109 of the insulating body 105 (departing from it, up in the figures). Each fin 325 comprises, in succession from the base 320, a fin proximal portion 330, a fin distal portion 335 and a fin terminal portion 340. In more detail, the proximal portion 330 extends transversal to the free surface 109 of the insulating body 105 from the base 320, the distal portion 335 is bent outward in such a way to be parallel to the free surface 109 of the insulating body 105, and the terminal portion 340 is bent so that to be parallel to the proximal portion 330 (i.e., transversal to the free surface 109) and to extend towards the free surface 109 (i.e., down in the figures).

The distal portion 335 and the terminal portion 340 allow the transfer of heat by convention in a location far from the electronic device 300 in such a way to facilitate the cooling of the chip of the electronic component during operation.

In the solution according to an embodiment, the heatsink 315 comprises front stabilization bridge elements 350A and back stabilization bridge elements 350B (two front stabilization bridge elements 350A and two rear stabilization bridge elements 350B in the embodiment shown in the figures) that extend from the sides of the perimeter of the base 320 so as to be interspersed with the fins 325. Preferably, though not necessarily, the stabilization elements 350A and 350B are formed so that each front stabilization element 350A is diametrically opposed to a rear stabilization element 350B. Each stabilization element 350A, 350B comprises (in succession from the base 320) an attachment portion comprising a proximal portion 355A, 355B and a distal portion 360A, 360B; each stabilizing element 350A, 350B also comprises a mounting portion comprising a connection portion 365A, 365B and a terminal portion 370A, 370B.

In more detail, the proximal portion 355A, 355B extends transversal to the free surface 109 of the insulating body 105 connected to the base 320. The distal portion 360A, 360B is bent outward so that it is parallel to the free surface 109 of the insulating body 105 and extends in plan view beyond the boundary 347 of the insulating body 105. The connection portion 365A, 365B is bent in such a way to be parallel to the proximal portion 355A, 355B (thus, transversal to the free surface 109) and extends up to the plane defined by the board 305. Finally, the terminal portion 370A, 370B is bent so as to lie on the plane of the board 305 (and therefore also on the plane of the mounting surface) and to be parallel to the plane defined by the board 305. Preferably, though not necessarily, the terminal portion 370A, 370B extends in the direction opposite to that of the electronic device 300. Moreover, the terminal portion 370A, 370B may be attached to the board 305 (on appropriate pads provided for this purpose, not shown, or on non-conductive parts of the board 305) as previously described with reference to the base 320.

The stabilizing elements 350A and 350B perform functions that solve, or at least reduce, the problems of solutions known in the art. A first function is to operate as a mechanical bond between the heatsink 315 and the board 305 through the respective terminal portions 370A and 370B attached to the board 305, each of which provides a mechanical bond between the heatsink 315 and the board 305. In this way, the heatsink 315 is also fixed with extra strength to the package 103. Indeed, the stabilization elements 350A and 350B are formed with a structure that exerts a spring force that keeps the heatsink 315 substantially pressed to the free surface 109 of the insulating body 105, to be added to the mechanical bound provided by the mounting of the base 320 to the free surface 109 of the insulating body 105 described above. Another function of the stabilization elements 350A and 350B, is to provide improved resistance to mechanical stresses to which the electronic device 300 can be subjected. In detail, the stabilizing elements 350A and 350B exert a damping function of the mechanical stresses which are discharged on the board 305 rather than affecting, and potentially compromising, the attachment between the base 320 and the free surface of the insulating body 105. In addition, the stabilization elements 350A and 350B dissipate heat transferred from the package 103 to the base 320 in a similar manner to the heat dissipation performed by the heat dissipation fins 325 previously described.

Let's consider that on the free surface 109 of the insulating body 105 there is the dissipation plate. In this case, the heatsink 315 is biased to the voltage of the source pin 120S through the connection between the dissipation plate and the base 320 of the heatsink 315. The heatsink 315 is designed and placed on the insulating body 105 so as to ensure compliance with appropriate safety distances between portions of the heatsink 315 and the pins 120G and 120D, and between the portions of the heatsink 315 and the tie bars 125 to prevent the occurrence of arc discharges, since such elements are polarized at different potential levels during the operation of the electronic device 300. Such safety distances comprise the so-called surface distance or "creepage" and the so-called air distance or "clearance". In particular, with surface distance it is meant the minimum distance between two elements of the electronic device—each polarized at a different level of electric potential—measured along surfaces of the electronic device, such that between this pair of elements no electric arc discharge originates. Furthermore, with air distance it is meant the shortest distance between two elements of the electronic device—each polarized at a different level of electric potential—measured as the crow flies, such that between such couple of elements no electric arc discharge originates. Both the surface distance and the air distance are proportional to the difference between the voltages of the biased elements (for example, with a factor of proportionality between 1 mm/KV and 10 mm/KV); thus, such distances are greater in the case of power electronic devices (since the high potential differences between terminals of the electronic component).

In detail, the heatsink 315 should be positioned so that each of its parts (i.e., the base 320, the fins 325 and the stabilization elements 350A and 350B) is at least at a first surface distance x (in the order of millimeters) from the pin 120G and at least at a second surface distance y from the tie bars 125—again in the order of millimeters and greater than the first surface distance x since that the tie bars 125 are biased to the voltage of the pin 120D, higher than the voltage of the pin 120G—to prevent the occurrence of surface electric discharges along the surfaces of the insulating body 105 and/or the board 305. In addition, the heatsink 315 should comply with a first air distance u (of the order of millimeters) from the gate pin 120G, and a second air distance t—in the order of millimeters, as in the previous case greater than the first air distance u because of the high voltage to which the tie bars 125 are biased with respect to pin gate 120G—from the tie bars 125 to prevent the occurrence of electric arc discharges between the pin 120G or the tie bars 125 and the heatsink 315 across the medium by which the electronic device 300 is surrounded (e.g., air). For this reason, the distal portions 360B of the rear stabilization elements 350B are typically formed with a length $l_B$ greater than a length $l_A$ of the distal portions 360A of the front stabilization elements 350A. In fact, the rear stabilization elements 350B are close to the drain track 310D biased by the drain pin 120D which is usually at a very high voltage (for example, in the hundreds of Volts for a power transistor) and greater than the voltages to which the source 120G and gate 120S pins are biased and consequently the respective tracks 310S and 310G on the board 305.

It is emphasized that the solution described above may also be applied to a package/heatsink system adapted to be marketed without the chip, which can then be placed inside the package at a later time by the buyer.

Figure 4A:
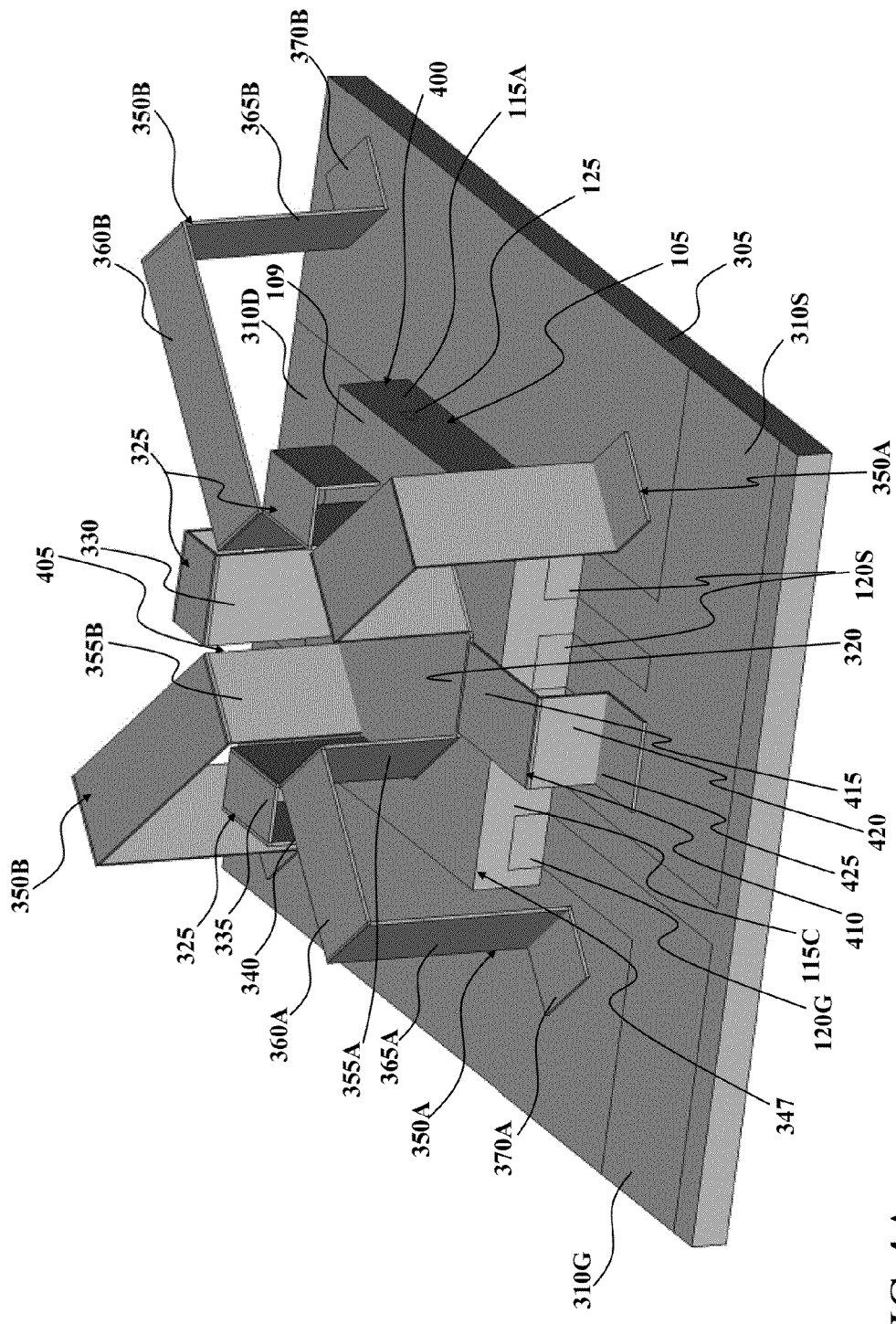
FIG. 4A illustrates a schematic axonometric view of a further electronic device according to a further embodiment and of a portion of the board on which it is attached.
Figure 4B:
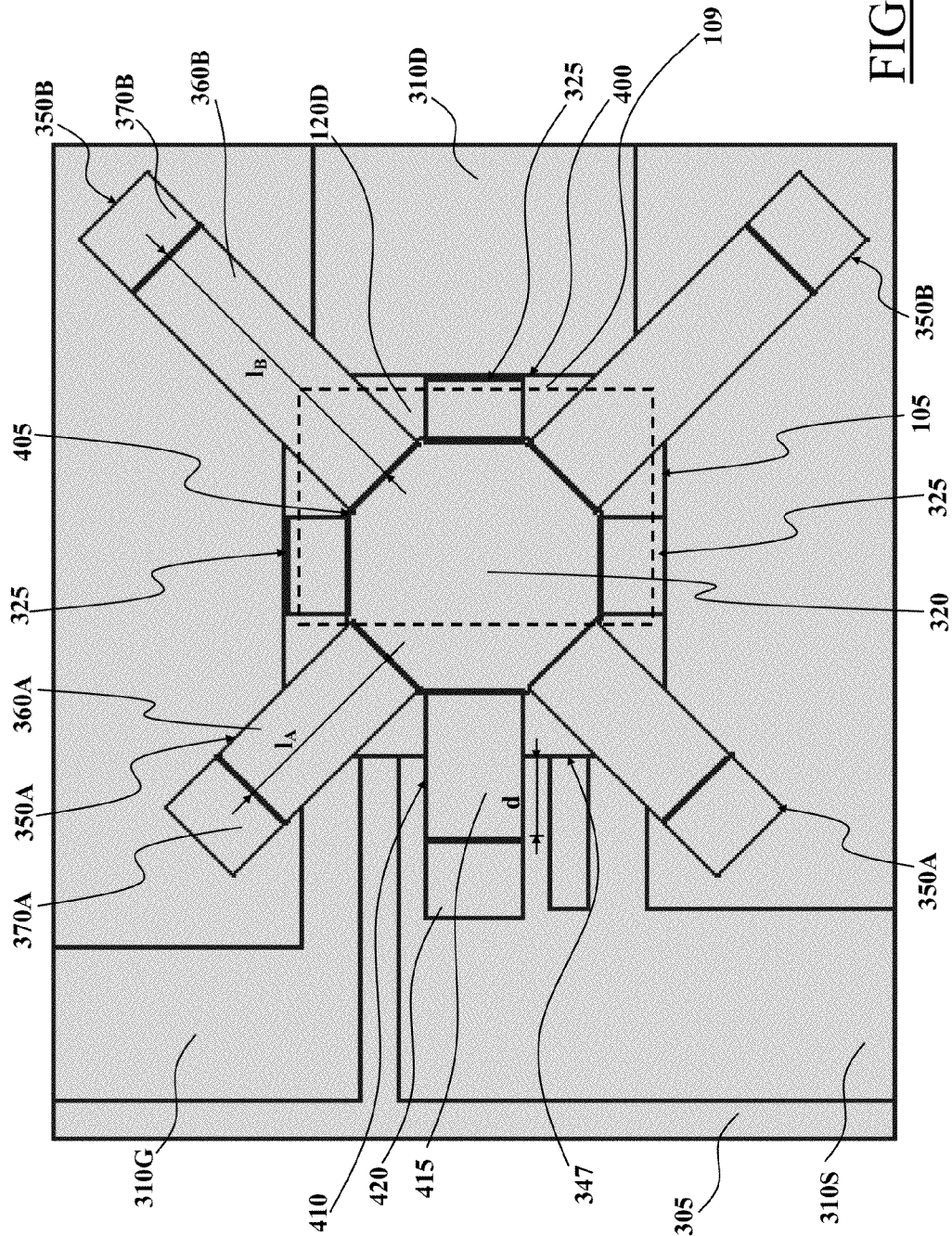
FIG. 4B illustrates a schematic plan view of the further electronic device of FIG. 4A and of the portion of the board on which it is attached.

Turning now to FIG. 4A and FIG. 4B, in which a schematic axonometric view from above and a schematic in plan view, respectively, of a further electronic device 400 according to a further embodiment.

The electronic device 400 differs from what has previously been described in relation to FIG. 3A and FIG. 3B as follows. The electronic device 400 comprises a heatsink 405 in its turn comprising a protruding element (for example, a tab) 410 that protrudes from one edge of the base 320 beyond the boundary 347 of the insulating body 105. In more detail, the protruding element 410 is parallel to the free surface 109 and rests on the same surface up to the boundary 347 of the insulating body 105. A connection portion 415 of the protruding element 410 rests on the free surface 109 and can be attached to the latter as the base 320. The protruding element 410 protrudes from the boundary 347, and it is bent so as to present a graft portion comprising a middle portion 420 transversal to the free surface 109 and extending toward the mounting surface 107. In the particular embodiment shown in the figures, the protruding element 410 is also bent at the board 305 in such a way to have a terminal portion 425 parallel the same, lying on the floor of the mounting surface 107, and thus on the board 305, too. The terminal portion 360 is then fixed to the board 305 (as described above for the base 320). Alternatively, the intermediate portion 420 may be configured to pass through the board 305 and be attached to it through appropriate holes (through hole in the jargon).

The electronic device 400 is attached to the board 305 by the protruding element 410 as well as by the stabilization elements 350A and 350B. This provides an increased mechanical stability to the heatsink 315 compared to the previous case, once the terminal portion 425 is attached to the board 305; consequently, the electronic device 400 is even more robust against mechanical stresses to which it may be subjected. In addition, the weight of the heatsink 315 is discharged at least partly directly onto the board 305 through the protruding element 410. In this way, the possibility of a deterioration, or even a breaking, of contacts formed between one or more of the pins 120S, 120G and 120D of the insulating body 105 and the corresponding tracks 3105, and 310G 310D which they are attached, due to the weight of the heatsink 315 and/or mechanical stress is nullified, or at least reduced. An electronic device 400 even more reliable than the previous case is thus obtained. At the same time, the protruding element 410 also contributes to heat dissipation by transferring heat both by convection to the external environment, and by conduction to the board 305.

In a specific embodiment of the invention, when the electronic component is a power MOS transistor and the heatsink 405 is electrically connected to the respective source terminal (i.e., when the heatsink 405 is electrically connected to the chip arranged inside the insulating body 105), the terminal portion 420 of the protruding element 410 may extend at least partially above the corresponding track 3105 (to which it is attached the pins 120S), and then be attached to it. In this way, it is further provided a conductive path that enhances the connection to the source terminal of the MOS transistor. Preferably, the terminal portion 420 is fixed to the track 310S in the same way as the base 320 is fixed to the free surface 109 (even in this case, to avoid formation of air bubbles that may reduce the thermal conductivity between the terminal portion 420 and the track 310S).

In particular, the protruding element 410 may protrude from the boundary 347 for a distance d sufficient for allowing a simple inspection of the contact between the pin 120S and the track 310S (for example, 1-5 mm).

In addition, it should be considered that when the terminal portion 420 of the protruding element 410 is electrically connected to the track source 310S and thus to the source pin 120S (as described above) the whole heatsink will be biased to the operating voltage of such pin. Consequently, the protruding element 410 will be designed and positioned on the insulating body 105 in order to maintain a distance greater than or equal to the surface distances x and y, and the air distances u and t (previously described) from the gate 120G and drain 120D pins, from their respective tracks 310G and 310D, and from the 125 tie-bars. In this way the occurrence of the harmful above-described electric discharge is prevented.

In other embodiments (not shown in the figures), the fins, and/or bridge elements and/or the protruding element of the heatsink may be provided with slots or openings. This configuration of the heatsink is advantageous in the cases in which a greater heat transfer through the phenomenon of convection of heat rather than through the phenomenon of conduction is required (e.g., in implementations in which the electronic component is operative for long periods of time, for example in the order of hours or days). In facts, the slots allow a greater circulation of air between the parts of the heatsink compared to the case of solid shapes of the above-described embodiments. Furthermore, as it is known, the convective heat transfer is proportional to the perimeter of the heatsink that is substantially increased by the presence of the slots.

In alternative embodiments (not shown in the figures) the stabilizing elements may be formed by one or more arched portions having a curvature such that they extend above the free surface of the insulating body (on which the heatsink is attached) and, after crossing the boundary of the insulating body, reach the plane of the board on which the package is attached.

Alternatively, the protruding and/or stabilizing elements may be configured to traverse the board and be fixed to it through appropriate holes.

In yet further embodiments (not shown in the figures) heatsinks may be provided with additional fins arranged on the surface of the base and departing therefrom; in this way it is possible to further increase the heat exchange between the electronic device and the external environment.

In general, all the above-described heatsinks can be formed through a process of molding of a sheet of thermally conductive material (e.g., an aluminum foil), followed by a phase of bending of the molded sheet. Consequently, these heatsinks can be manufactured in large volumes at low cost and with relatively simple manufacturing equipment.

Naturally, in order to satisfy local and specific requirements, a person skilled in the art may apply to the solution described above many logical and/or physical modifications and alterations. More specifically, although this solution has been described with a certain degree of particularity with reference to one or more embodiments thereof, it should be understood that various omissions, substitutions and changes in the form and details as well as other embodiments are possible. Particularly, different embodiments of the invention may even be practiced without the specific details (such as the numerical examples) set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any embodiment of the disclosed solution may be incorporated in any other embodiment as a matter of general design choice. For example, the solution according to the present invention is not limited to SMT but is applicable to other installation technologies, for example, the Through-Hole Technology or THT.

It should be readily apparent that the proposed solution might be part of the design of an integrated device. The design may also be created in a programming language; in addition, if the designer does not manufacture the integrated device or its masks, the design may be transmitted through physical means to others. Moreover, the solution may be integrated with other circuits in the same chip, or it may be mounted in intermediate products (such as motherboards). In any case, the solution is adapted to be used in complex systems (such as automotive or mechanisms actuation systems).

Similar considerations apply whether the same solution is implemented by an equivalent method (using similar steps with the same functions of multiple steps or portion thereof, removing some steps being not essential, or adding further optional steps); moreover, the steps may be performed in different order, in parallel or overlapped (at least in part).

What is claimed is:

1. A system, comprising:
an insulating body configured to incorporate at least one chip of semiconductor material incorporating an electronic component having a set of terminals, the insulating body having a mounting surface configured to be mounted on a board and a free surface opposite the mounting surface, at least one conductive element exposed from the insulating body and connected to one of the terminals of the electronic component, and
a heatsink provided at the free surface of the insulating body,
wherein the heatsink comprises at least one stabilizing element having:
an attachment portion extending at least partly transversal to the free surface beyond a boundary of the free surface in plan view, the attachment portion having a binding end bound to the free surface and a free end opposite to the binding end, wherein the attachment portion comprises a proximal portion transversal to the free surface of the insulating body and a distal portion substantially parallel to the free surface of the insulating body, and
a mounting portion extending from the free end of the attachment portion at least to a plane corresponding to the mounting surface, wherein the mounting portion comprises a mounting connection portion connected to the distal portion, said mounting connection portion extending transversally with respect to the free surface up to said plane, and a terminal portion lying on said plane, and
wherein each stabilizing element is configured to be separated from each conductive element by a creepage distance such as to avoid arising of electric discharges.

2. The system according to claim 1, wherein the heatsink comprises an attachment base above the free surface, the at least one stabilizing element extending from the attachment base.

3. The system according to claim 2, wherein the insulating body further includes an opening on the free surface exposing a dissipation plate in contact with said at least one chip.

4. The system according to claim 1, further comprising a protruding element comprising: a protruding connection portion partly extending in contact with the free surface and partly protruding beyond the boundary of the free surface, the protruding connection portion having a binding end bound to the free surface and a free end opposite the binding end, and a graft portion extending from the free end at least up to said plane.

5. The system according to claim 4, wherein the protruding element extends up to a non-zero distance from a side surface of the insulating body between the mounting surface and the free surface.

6. The system according to claim 2, wherein the heatsink further comprises at least one fin extending from the attachment base transversally to the free surface departing from the insulating body.

7. The system according to claim 6, wherein each fin has at least one aeration structure.

8. The system according to claim 6, in which each fin comprises a fin distal portion extending parallel to the free surface bent substantially parallel to the free surface and a fin terminal portion bent towards the free surface.

9. An electronic assembly, comprising:
a board including conductive tracks;
an insulating body configured to incorporate at least one chip of semiconductor material incorporating an electronic component having a set of terminals, the insulating body having a mounting surface mounted on said board, a free surface opposite the mounting surface and a peripheral side surface between the mounting and free surfaces, at least one conductive element exposed from the peripheral side surface of the insulating body and connected to one of the terminals of the electronic component and to one of the conductive tracks, and
a heatsink provided at the free surface of the insulating body,
wherein the heatsink comprises at least one stabilizing element having:
an attachment portion extending at least partly transversal to the free surface beyond a boundary of the free surface in plan view, the attachment portion having a binding end bound to the free surface and a free end opposite to the binding end, and
a mounting portion extending from the free end of the attachment portion at least partly transversal to the free surface for attachment to a top surface of said board at a plane corresponding to the mounting surface, and wherein the mounting portion of each stabilizing element is configured to be separated from each conductive element exposed from the peripheral side surface of the insulating body by a creepage distance such as to avoid arising of electric discharges.

10. A method, comprising:
providing an insulating body incorporating at least one chip of semiconductor material which integrates an electronic component having a set of terminals, the insulating body having a mounting surface for mounting the insulating body on a board and a free surface opposite to the mounting surface, at least one conductive element exposed from the insulating body and connected to one of the terminals of the electronic component, and
deploying a heatsink for dissipating the heat produced by said at least one electronic component at the free surface of the insulating body,
providing the heatsink with at least one stabilizing element having:
an attachment portion extending at least partially transversally to the free surface beyond a boundary of the free surface in plan view, the attachment portion having a binding end bound to the free surface and a free end opposite to the binding end, wherein the attachment portion comprises a proximal portion transversal to the free surface of the insulating body and a distal portion substantially parallel to the free surface of the insulating body, and
a mounting portion extending from the free end of the attachment portion at least to a plane corresponding to the mounting surface, wherein the mounting portion comprises a connection portion connected to the distal portion, said connection portion extending transversally with respect to the free surface UP to said plane, and a terminal portion lying on said plane, and
separating each stabilizing element from each conductive element by a creepage distance such as to avoid arising of electric discharges.

11. The method according to claim 10, wherein the step of providing the heatsink with the at least one stabilizing element comprises: forming the heatsink from a sheet of thermally conductive material through a molding and folding process.

12. A heat sink, comprising:
a semiconductor chip attachment portion having a binding end configured to be bound to a free surface of a semiconductor chip insulating body and a free end which extends beyond a peripheral edge of the semiconductor chip insulating body, wherein the attachment portion comprises:
an attachment base;
a proximal portion extending from and oriented transversal to the attachment base; and
a distal portion extending from and oriented substantially parallel to the attachment base; and
a mounting portion extending from the free end of the attachment portion at least to a plane corresponding to a mounting surface of said semiconductor chip insulating body which is opposite said free surface, wherein the mounting portion comprises:
a mounting connection portion extending from and oriented transversal to the distal portion, and
a terminal portion extending from and oriented transversal to the mounting connection portion.

13. The heat sink according to claim 12, wherein the terminal portion is positioned in said plane.

14. The heat sink according to claim 12, wherein the attachment portion further comprises an attachment connection portion extending coplanar with the attachment base.

15. The heat sink according to claim 14, wherein the mounting portion comprises: a graft portion extending from and oriented transversal to the attachment connection portion.

16. The heat sink according to claim 15, wherein the graft portion includes a terminal portion oriented parallel to the attachment base and positioned in said plane.

17. The heat sink according to claim 12, further comprising at least one fin extending from the semiconductor chip attachment portion and oriented transversal to the free surface.

* * * * *